United States Patent
Fujii

(10) Patent No.: US 11,319,627 B2
(45) Date of Patent: May 3, 2022

(54) VACUUM PROCESSING APPARATUS

(71) Applicant: ULVAC, INC., Kanagawa (JP)

(72) Inventor: Yoshinori Fujii, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 17/263,802

(22) PCT Filed: Jul. 23, 2019

(86) PCT No.: PCT/JP2019/028829
§ 371 (c)(1),
(2) Date: Jan. 27, 2021

(87) PCT Pub. No.: WO2020/136964
PCT Pub. Date: Jul. 2, 2020

(65) Prior Publication Data
US 2021/0198784 A1 Jul. 1, 2021

(30) Foreign Application Priority Data

Dec. 27, 2018 (JP) .............................. JP2018-245446

(51) Int. Cl.
*H01J 37/32* (2006.01)
*C23C 14/35* (2006.01)
(Continued)

(52) U.S. Cl.
CPC .......... *C23C 14/35* (2013.01); *C23C 14/3407* (2013.01); *C23C 14/54* (2013.01);
(Continued)

(58) Field of Classification Search
None
See application file for complete search history.

(56) References Cited

U.S. PATENT DOCUMENTS

| | | | |
|---|---|---|---|
| 5,518,593 A * | 5/1996 | Hosokawa | ............ C23C 14/3407 118/641 |
| 6,084,213 A | 7/2000 | Kohav et al. | |
| 2004/0149716 A1* | 8/2004 | Inagawa | ............ H01L 21/67109 219/405 |

FOREIGN PATENT DOCUMENTS

| | | |
|---|---|---|
| JP | 2010-084169 A | 4/2010 |
| JP | 2014-091861 A | 5/2014 |
| JP | 2015-000994 A | 1/2015 |

OTHER PUBLICATIONS

International Search Report for PCT Patent App. No. PCT/JP2019/028829 (dated Sep. 17, 2019).

* cited by examiner

*Primary Examiner* — Jason Berman
(74) *Attorney, Agent, or Firm* — Cermak Nakajima & McGowan LLP; Tomoko Nakajima

(57) ABSTRACT

Provided is a vacuum processing apparatus which is capable of performing baking processing of a deposition preventive plate without impairing the function of being capable of cooling the deposition preventive plate disposed inside a vacuum chamber. The vacuum processing apparatus has a vacuum chamber for performing a predetermined vacuum processing on a to-be-processed substrate that is set in position inside the vacuum chamber. A deposition preventive plate is disposed inside the vacuum chamber. Further disposed are: a metallic-made block body vertically disposed on an inner surface of the lower wall of the vacuum chamber so as to lie opposite to a part of the deposition preventive plate with a clearance thereto; a cooling means for cooling the block body; and a heating means disposed between the part of the deposition preventive plate and the block body to heat the deposition preventive plate by heat radiation.

9 Claims, 5 Drawing Sheets

(51) Int. Cl.
*C23C 14/34* (2006.01)
*C23C 14/54* (2006.01)
*H01L 21/285* (2006.01)

(52) U.S. Cl.
CPC ...... *C23C 14/541* (2013.01); *H01J 37/32651* (2013.01); *H01J 37/32724* (2013.01); *H01L 21/2855* (2013.01)

VACUUM PROCESSING APPARATUS

This application is a national phase entry under 35 U.S.C. §371 of PCT Patent Application No. PCT/JP2019/028829, filed on Jul. 23, 2019, which claims priority under 35 U.S.C. §119 to Japanese Patent Application No. 2018-245446, filed Dec. 27, 2018, both of which are incorporated by reference.

TECHNICAL FIELD

The present invention relates to a vacuum processing apparatus having a vacuum chamber and performs a predetermined vacuum processing on a substrate to be processed (hereinafter referred to as a "to-be-processed substrate") set in the vacuum chamber.

BACKGROUND ART

In a process of manufacturing, e.g., semiconductor devices, there is included a step in which a predetermined vacuum processing such as film forming processing and etching processing is performed on a to-be-processed substrate such as a silicon wafer, and the like. As a vacuum processing apparatus to be used in this kind of vacuum processing, there is known in patent document 1 a sputtering apparatus for performing film forming by a sputtering method. This apparatus has a vacuum chamber which is capable of forming a vacuum atmosphere. In an upper part of the vacuum chamber there is disposed a target for sputtering. In a lower part of the vacuum chamber there is provided a stage on which is set in position a to-be-processed substrate in a manner to lie opposite to the target.

In forming a predetermined thin film by using the above-mentioned sputtering apparatus, in a state in which the single to-be-processed substrate is set in position on the stage, an inert gas (and a reactive gas) are introduced into the vacuum chamber in vacuum atmosphere, and DC power having, e.g., a negative electric potential or an AC power of a predetermined frequency is applied to the target. According to this arrangement: a plasma atmosphere is formed inside the vacuum chamber; such ions of an inert gas as are ionized in the plasma get collided with the target and, consequently, the target gets sputtered; the sputtered particles splashed from the target get adhered to, and deposited on, the surface of the to-be-processed substrate, whereby a predetermined thin film is formed depending on the kind of the target. When the target gets sputtered, sputtered particles are partly splashed toward other than the to-be-processed substrate. In order to prevent the sputtered particles from adhering to the inner wall surface, the vacuum chamber is ordinarily provided with a deposition preventive plate of metal make at a distance from the inner wall surface of the vacuum chamber.

Here, at the time of film forming by sputtering, the deposition preventive plate is heated by radiant heat and the like of plasma so that, with the increase in number of the to-be-processed substrates, they gradually rise to higher temperature. When the deposition preventive plate rises in temperature, particularly, the sputtered particles come to eject various gases (oxygen, water vapor, and the like) without being vacuum-exhausting from the rear surface of the deposition preventive plate that is free from adhesion and deposition of the sputtered particles. Should these kinds of ejected gases be taken into the thin film at the time of film forming, deterioration in film quality, for example, will result. Therefore, such an occurrence must be suppressed to the extent possible. For that purpose, it is normal practice to cool the deposition preventing plate.

By the way, in case a deposition preventive plate that has not been put to actual use is set in position inside the vacuum chamber, it is normal practice, prior to film forming on the to-be-processed substrate, to perform so-called baking processing to heat the deposition preventive plate to a predetermined temperature in the vacuum atmosphere in order to degas the deposition preventive plate. A sputtering apparatus in which degassing can be performed is known, e.g., in patent document 2. This apparatus is provided with a lamp heater (heating means) for heating the deposition preventive plate through heat radiation, and a reflecting plate which is disposed on the rear surface of the lamp heater so that the heat rays radiated from the lamp heater can be reflected by the reflecting plate and the reflected heat rays can be irradiated to the deposition preventive plate. It is considered to dispose the lamp heater and the reflecting plate between the cooling means for cooling the deposition preventive plate and the deposition preventive plate so as to enable to perform baking processing of the deposition preventive plate. However, there is a problem in that the interposing of the reflecting plate will make it difficult to cool the deposition preventive plate.

PRIOR ART DOCUMENTS

Patent Documents

Patent Document 1: JP-2014-91861-A
Patent Document 2: JP-2010-84169-A

SUMMARY OF THE INVENTION

Problems that the Invention is to Solve

This invention has been made in view of the above-mentioned points and has an object of providing a vacuum processing apparatus in which, without impairing the function of being capable of cooling the deposition preventive plate which is disposed inside the vacuum chamber, the baking processing of the deposition preventive plate can be performed.

Means for Solving the Problems

In order to solve the above-mentioned problem, this invention is a vacuum processing apparatus comprising a vacuum chamber for performing a vacuum processing on a to-be-processed substrate set in position inside the vacuum chamber vacuum chamber having disposed therein the deposition preventive plate. The vacuum processing apparatus of this invention further comprises: a block body made of metal and vertically disposed along an inner wall surface of the vacuum chamber so as to lie opposite to a part of the deposition preventive plate with a clearance thereto; a cooling means for cooling the block body; and a heating means disposed between the part of the deposition preventive plate and the block body to enable to heat the deposition preventive plate by heat radiation. Such surface portions of the block body and the deposition preventive plate as lie opposite to each other are respectively made up of high-emissivity layers having an increased emissivity as a result of surface treatment to parent metal of the block body and the deposition preventive plate, respectively.

According to this invention, since such surface portions of the deposition preventive plate as lie opposite to the block body are made up of high-emissivity layers, at the time of performing baking processing to the deposition preventive plate, the heat rays from the heating means are absorbed by the high-emissivity layer of the deposition preventive plate, thereby being efficiently transmitted to the deposition preventive plate. Therefore, there is no need of disposing a reflection plate between the part of the deposition preventive plate and the block body. Further, such a surface portion of the block body as lies opposite to the deposition preventive plate is also made up of a high-emissivity layer. Therefore, in combination with the fact that the above-mentioned reflecting plate is not interposed, the function in that the deposition preventive plate can be cooled during the vacuum processing due to radiation cooling from the block body, is not impaired. By the way, such surface portions of the block body and the deposition preventive plate as lie opposite to each other, not only the case in which the block body and the surface portion of the deposition preventive plate parallelly lie opposite to each other, but also the case shall be understood to be included in which the above-mentioned both members lie opposite to each other at a predetermined angle, e.g., the opposing surface of the block body is inclined relative to the surface portion of the deposition preventive plate.

In this invention, preferably, such a surface portion of the block body as lies opposite to the heating means is made up of a low-emissivity layer having a lowered emissivity as a result of surface treatment to the parent metal of the block body. According to this arrangement, at the time of baking processing, the heat rays from the heating means can advantageously be reflected by the low-emissivity layer to thereby irradiate them to the deposition preventive plate.

In this invention, the vacuum processing apparatus preferably further comprises a first recessed part formed on such a surface of the block body as lies opposite to the deposition preventive plate, wherein the heating means is housed in an inside space of the first recessed part. According to this arrangement, since the distance between the block body and the deposition preventive plate can be made shorter, the deposition preventive plate can efficiently be cooled. In this case, the inner surface of the first recessed part is preferably made up of a low-emissivity layer having a lowered emissivity as a result of surface treatment to the parent metal of the block body. Then, the heat rays from the heating means at the time of baking processing can advantageously be reflected by the low-emissivity layer so as to irradiate them to the deposition preventive plate.

Further, in this invention, preferably, such a surface portion of the deposition preventive plate as lies opposite to the block body has formed therein a second recessed part, and the heating means is housed in an inner space of the second recessed part. According to this arrangement, the distance between the block body and the deposition preventive plate can be shortened. Therefore, the deposition preventive plate can advantageously be cooled efficiently.

MODES FOR CARRYING OUT THE INVENTION

With reference to the drawings, a description will hereinafter be made of an embodiment of a vacuum processing apparatus based on an example in which, provided that the vacuum processing apparatus is a magnetron type of sputtering apparatus, and that the to-be-processed substrate is a silicon wafer (hereinafter referred to as a "substrate Sw"), a predetermined thin film is formed on a surface of the substrate Sw. In the following description, the terms denoting the direction shall be based on the posture of installation of the sputtering apparatus as the vacuum processing apparatus as shown in FIG. 1.

Figure 1:
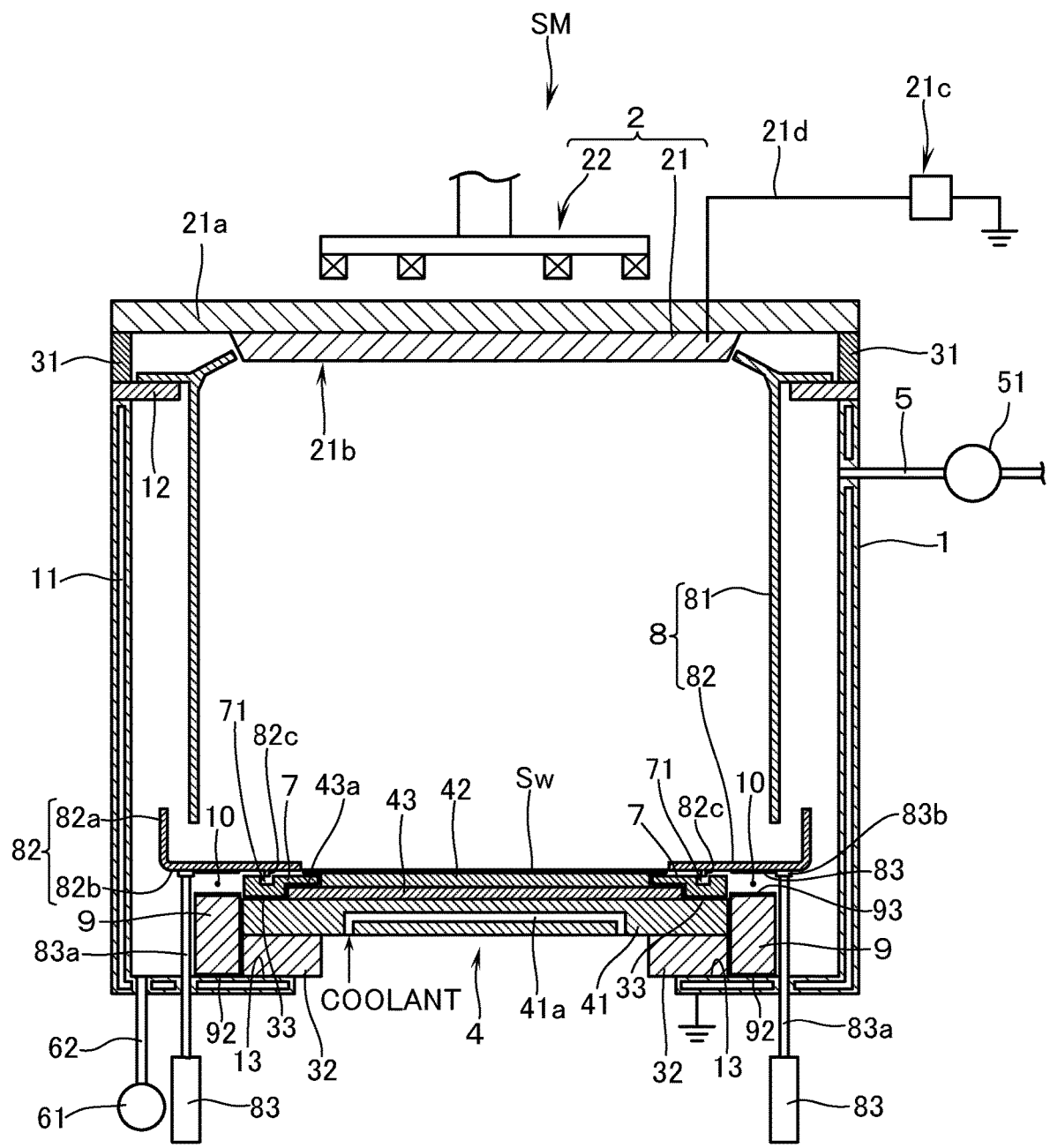
FIG. 1 is a schematic sectional view showing a sputtering apparatus according to an embodiment of this invention.

With reference to FIG. 1, the mark SM denotes a sputtering apparatus according to this embodiment. The sputtering apparatus SM is provided with a vacuum chamber 1. The side walls and the lower wall of the vacuum chamber 1 are provided with a jacket 11 connected to a circulation unit for a heating medium or a coolant (not illustrated) so that the side wall and the lower wall of the vacuum chamber can be heated or cooled by appropriately circulating the heating medium or the coolant. An opening on an upper surface of the vacuum chamber 1 has detachably mounted therein a cathode unit 2.

The cathode unit 2 is made up of a target 21, and a magnet unit 22 which is disposed above the target 21. As the target 21 there will be utilized known one of aluminum, copper, titanium, aluminum oxide, and the like. As to the target 21, in a state in which it is mounted on a backing plate 21a and in a posture in which the sputtering surface 21b (i.e., the surface to get sputtered) faces downward, the target is mounted on an upper part of the vacuum chamber 1 through an insulating body 31 which is disposed on the upper wall of the vacuum chamber 1 and which also serves the purpose of a vacuum seal. The target 21 has connected thereto an output 21d from a sputtering power supply 21c which is made up of a DC power supply, an AC power supply, and the like depending on the kind of the target. Depending on the kind of the target, it is so arranged that a predetermined power supply having, e.g., a negative electric potential or a high-frequency power supply of a predetermined frequency can be supplied to the target 21. The magnet unit 22 has a known closed magnetic field or cusp magnetic field structure which generates a magnetic field in a space below the sputtering surface 21b of the target 21, collects the ions ionized below the sputtering surface 21b at the time of sputtering so as to efficiently ionize the sputtered particles splashed from the target 21. Detailed description will be omitted here.

At the lower part of the vacuum chamber 1, there is disposed a stage 4 in a manner to lie opposite to the target 21. The stage 4 is made up of: a base 41 which is disposed through an insulating body 32 provided at the lower part of the vacuum chamber 1 and which is made of metal (e.g., made of stainless steel) having a cylindrical contour; and a chuck plate 42 which is disposed on the upper surface of the base 41. The base 41 has formed therein a coolant circulation passage 41 for circulating a coolant supplied from a chiller unit (not illustrated) to enable selective cooling. The chuck plate 42 has an outer diameter which is slightly smaller than the upper surface of the base 41, and has buried therein electrodes for an electrostatic chuck. It is thus so arranged that, when voltage is applied to the electrodes from a power supply (not illustrated), the substrate Sw gets electrostatically sucked to the upper surface of the chuck plate 42. Further, between the base 41 and the chuck plate 42, there is interposed a hot plate 43 made, e.g., of aluminum nitride. The hot plate 43 has buried therein a heating means (not illustrated) such as a heater and the like. It is thus so arranged that by energizing the heating means from a power source (not illustrated), the hot plate can be heated to a predetermined temperature (e.g., 300° C. to 500° C.). In this case, it is also possible to embed a heater into the chuck plate 42 so as to form the chuck plate 42 and the hot plate 43 integrally. It is thus so arranged that the substrate Sw is controlled to a predetermined temperature (e.g., 350° C.) above the room temperature by the heating with the hot plate 43 and by the cooling of the base 41 with the circulation of the coolant through the coolant circulation passage 41a.

The side wall of the vacuum chamber 1 has connected thereto a gas pipe 5 for introducing a sputtering gas, and the gas pipe 5 is communicated with a gas source (not illustrated) through a mass flow controller 51. The sputtering gas includes not only the inert gas such as argon gas and the like that is introduced at the time of forming a plasma in the vacuum chamber 1, but also the reactive gas such as oxygen gas, nitrogen gas, and the like. Further, the lower wall of the vacuum chamber 1 has connected thereto an exhaust pipe 62 which is in communication with a vacuum pump 61 which is made up of a turbo molecular pump, a rotary pump, and the like. It is thus so arranged that the vacuum chamber 1 is evacuated so as to maintain the vacuum chamber 1 at a predetermined pressure in a state in which the sputtering gas has been introduced at the time of sputtering.

Around the stage 4 inside the vacuum chamber 1, there is provided a platen ring 7 in a manner to cover an outer peripheral portion 43c of an upper surface of the hot plate 43 at a clearance therefrom, the platen ring thereby serving the purpose as a deposition preventive plate to prevent the sputtered particles generated by the sputtering of the target 21 from getting adhered to the portion 43c in question. The platen ring 7 is made of a known material such as aluminum oxide, stainless steel, and the like, and is disposed through an insulating body 33 on the outer periphery on the upper surface of the base 41. Further, inside the vacuum chamber 1, there is disposed a deposition prevention plate 8 for preventing the sputtered particles from getting adhered to the inner wall surface of the vacuum chamber 1.

The deposition preventive plate 8 is made up of an upper deposition preventive plate 81 and a lower deposition preventive plate 82, each being made of a known material such as aluminum oxide, stainless steel and the like. The upper deposition preventive plate 81 has a cylindrical contour and is suspended by an engaging part 12 provided on an upper part of the vacuum chamber 1. The lower deposition preventive plate 82 has also a cylindrical contour and, on a free end of the radially outside, has formed an erected wall part 82a which is erected upward. The lower deposition preventive plate 82 has connected thereto a drive shaft 83a from a driving means 83 such as a motor, an air cylinder, and the like, the drive shaft 83a extending through the lower wall of the vacuum chamber 1. On an upper end of the drive shaft 83a there is disposed a guide ring 83b, and on the guide ring 83b there is disposed the lower deposition preventive plate 82. By the driving means 83 the lower deposition preventive plate 82 can be moved up and down between: a film forming position in which the film forming is performed by sputtering; and a transport position which is higher than the film forming position and in which handing over of a substrate Sw to the stage 4 is performed by means of a vacuum robot (not illustrated). It is so designed that, at the film forming position, the lower end part of the upper deposition preventive plate 81 and the upper end part of the erected wall part 82a are overlapped with each other in the vertical direction.

Such a flat part 82b of the lower deposition preventive plate 82 as extends at right angles to the vertical direction is sized such that the diametrically inside part lies opposite to the platen ring 7. In a predetermined position on the lower surface of the flat part 82b, there is formed a single annular projection 82c. An upper surface of the platen ring 7 has formed therein an annular recessed groove 71 in a manner to correspond to the projection 82c. Then, at the film forming position, the projection 82c of the flat part 82b and the recessed groove 71 of the platen ring 7 form a so-called labyrinth seal. It is thus so arranged that the sputtered particles can be prevented from wrapping (turning) around into such a space inside the vacuum chamber 1 as is positioned below the lower deposition preventive plate 82 in the circumference of the substrate Sw. In addition, the sputtering apparatus SM is provided with a control means (not illustrated) of a known construction having a microcomputer, a memory element, a sequencer, and the like. This control means performs an overall control over each of the parts such as the sputtering power supply 21c, other power supplies, mass flow controller 51, vacuum pump 61 and the like at the time of sputtering. A description will now be made of a film forming method based on an example of a method of forming an aluminum film on the surface of a substrate Sw by the above-mentioned sputtering apparatus SM, the target being defined as aluminum.

After having evacuated the vacuum chamber 1 by operating the vacuum pump 61, at the transfer position of the lower deposition preventive plate 82, the substrate Sw is transferred by a vacuum transfer robot (not illustrated) onto the stage 4, and the substrate Sw is placed in position on the upper surface of the chuck plate 42. Once the vacuum transfer robot has retreated, the lower deposition preventive plate 82 is moved to the film forming position, and a predetermined voltage is applied from the power supply (not illustrated) to the electrodes of the chuck plate 42. The substrate Sw is thus electrostatically sucked to the chuck plate 42. Together with the above operations, by the heating of the hot plate 43 and by the cooling of the base 41 due to circulation of the coolant through the coolant circulation passage 41a, the substrate Sw is controlled to a predetermined temperature (e.g., 350° C.) above the room temperature. Once the substrate Sw has reached the predetermined temperature, argon gas as a sputtering gas is introduced in a predetermined amount (e.g., argon partial pressure of 0.5 Pa) and, together with the above, a predetermined power (e.g., 3 kW to 50 kW) with negative electric potential is supplied from the sputtering power supply 21c to the target 21. According to these operations, a plasma is formed inside the vacuum chamber 1, the sputtering surface 21b of the target 21 gets sputtered by the ions of the argon gas in the plasma, and the sputtered particles from the target 21 get adhered to, and deposited on, the substrate Sw, thereby forming an aluminum film.

It is to be noted here that, at the time of film forming by sputtering, the upper deposition preventive plate 81 and the lower deposition preventive plate 82 get heated by the heat of radiation and the like of the plasma, and gradually become an elevated temperature with an increase in the number of substrates Sw on which films are formed. In the arrangement according to this embodiment, since the flat part 82b of the lower deposition preventive plate 82 lies opposite to the platen ring 7 that is heated by the radiation from the hot plate 43, the lower deposition preventive plate 82 is particularly likely to be heated. Then, when the upper deposition preventive plate 81 and the lower deposition preventive plate 82 (particularly the lower deposition preventive plate 82 that is positioned near the substrate Sw) rise in temperature, there will be ejected various gases (oxygen, water vapor and the like) that are not vacuum exhausted from the rear surfaces of the upper deposition preventive plate 81 and the lower deposition preventive plate 82, which are free from adhesion and deposition of the sputtered particles, but remain on the surfaces. Should this kind of ejected gases be captured into the thin film during film forming, deterioration in the film quality, for example, will be incurred and, therefore, this should be suppressed to the best extent possible.

Figure 2:
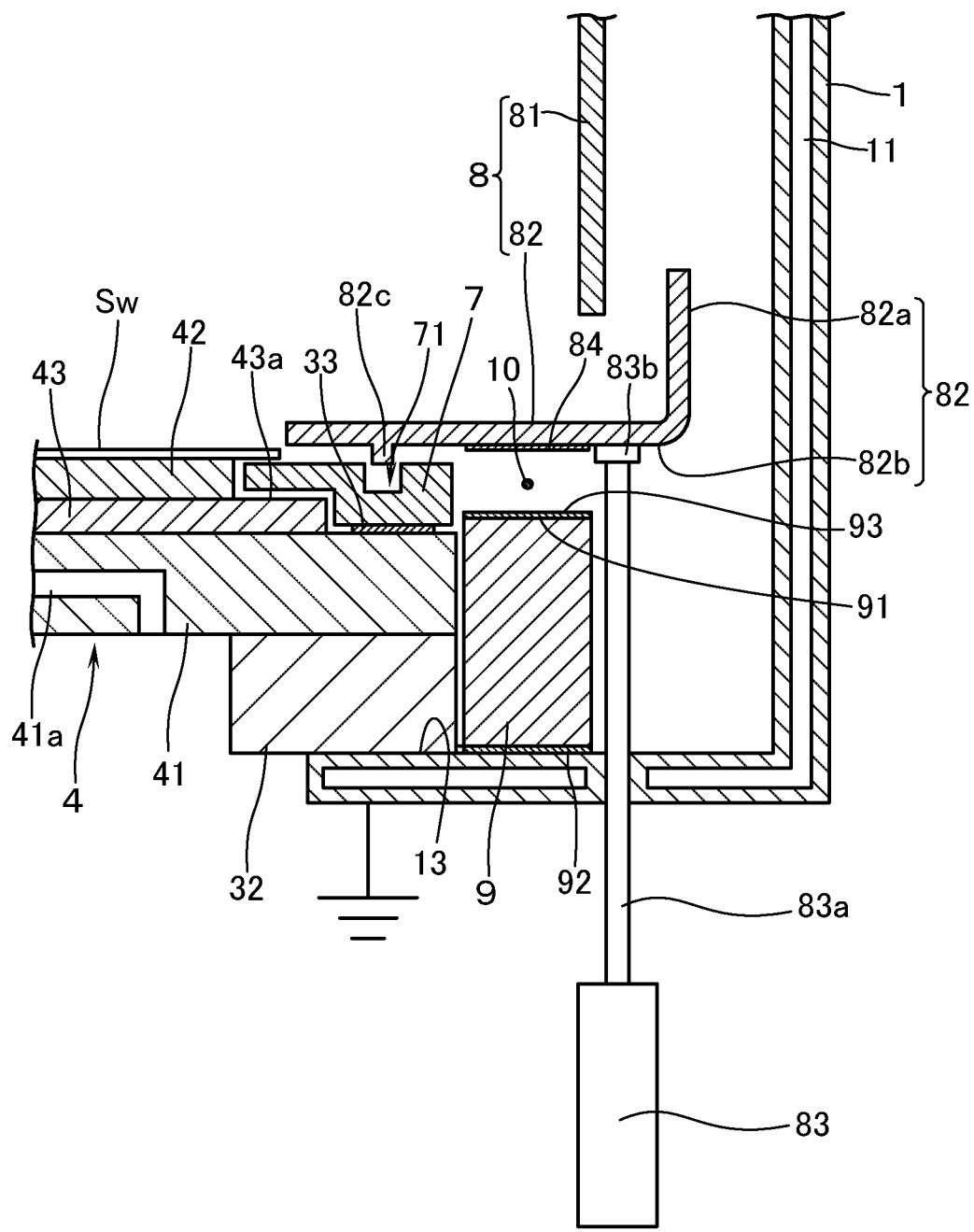
FIG. 2 is a sectional view showing in enlargement a part of FIG. 1.

As a solution, according to this embodiment, as shown in FIG. 2, in a manner to lie opposite to the flat part 82b of the lower deposition preventive plate 82, a block body 9 formed into a cylinder is vertically disposed on an inner surface of the lower wall of the vacuum chamber 1. The block body 9 is made up of a metal of good heat transfer characteristics such as aluminum, copper and the like. The height of the block body 9 to the top surface 91 thereof is measured to allow for a heating means 10 (to be described hereinafter) to be disposed in a processing position of the lower deposition preventive plate 82. In addition, between the inner surface 13 of the lower wall of the vacuum chamber 1 and the block body 9, there is interposed a heat transfer sheet 92 to improve the heat transmission, such as a silicon sheet, indium sheet and the like. However, this heat transfer sheet 92 may be omitted. In this arrangement, a predetermined cooling medium of a predetermined temperature is allowed to flow through the jacket 11 during film forming. It is so arranged that, during film forming, the block body 9 can be cooled to a predetermined temperature through heat transmission from the wall surface of the vacuum chamber 1 by circulating the coolant of a predetermined temperature through the jacket 11. In this embodiment, the jacket 11 constitutes the cooling means for cooling the block body 9. The volume of the block body 9, the area of the top surface 91 (the area of the surface that lies opposite to the deposition preventive plate), the position of the block body 9 relative to the lower deposition preventive plate 82, and the like will appropriately be set taking into consideration the temperature and the like of the lower deposition preventive plate 82.

Further, in this embodiment, there is disposed, between the block body 9 and the lower deposition preventive plate 82, a heating means 10 that is capable of heating the lower deposition preventive plate 82 by heat of radiation. As the heating means 10, there may be used, e.g., a known annular sheath heater, lamp heater and the like. It is, however, preferable to use a sheath heater. Since the structure of the sheath heater and the lamp heater is known, detailed description thereof will be omitted here inclusive of the method of installation. The top surface 91 of the block body 9 and the lower surface of the lower deposition preventive plate 82, both surfaces lying opposite to each other, are respectively made up of high-emissivity layers 93, 84 whose emissivity has been increased to 0.5 or more by subjecting them to blasting (surface treatment) of the surface of the mother metal of the block body 9 and the lower deposition preventive plate 82, the blasting being performed by using solid metal, mineral or vegetative abrasive material (particles) within a range, e.g., of particle diameters of 90 to 710 μm. It is to be noted here that the emissivity denotes an average emissivity within a range of wavelength of 2 to 6 μm. By the way, as the method of forming the high-emissivity layers 93, 84, use may be made, e.g., of etching processing or embossing. Further, there may be formed high-emissivity layers 93, 84 made up of non-metallic film of AlTiN, $Al_2O_3$ and the like or Ti spray coating film by subjecting the surface of the parent metal of the block body 9 and the lower deposition preventive plate 82 to surface treatment such as spray coating or film forming. Although not illustrated, by providing not only the top surface 91 but also the side surfaces of the block body 9 with high-emissivity layers 93, the irregularly reflected heat rays inside the vacuum chamber 1 can advantageously be absorbed. Further, not only a part of the lower surface of the lower deposition preventive plate 82 but also the entire lower surface thereof may be provided with a high-emissivity layer 84. The high-emissivity layer 84 may further be arranged to be disposed on such a side surface of the lower deposition preventive plate 82 as lies opposite to the inner wall surface of the vacuum chamber 1. Still furthermore, the high-emissivity layer 84 may be arranged to be disposed also on the side surfaces of the lower deposition preventive plate 82. In addition, the top surface 91 of the block body 9 and the lower surface of the lower deposition preventive plate 82 lie opposite to, and in parallel with, each other. However, such a surface of the block body 9 as lies opposite to the lower surface of the lower deposition preventive plate 82 may lie opposite to each other at a predetermined angle.

Then, prior to the film forming on the substrate Sw, there is conducted baking processing in which the lower deposition preventive plate 82 is heated to a predetermined temperature (e.g., 380° C.) by the above-mentioned heating means 10, thereby performing degassing from the lower deposition preventive plate 82. Here, since such a lower surface of the lower deposition preventive plate 82 as lies opposite to the block body 9 is made up of a high-emissivity layer 84, the heat rays from the heating means 10 will be absorbed by the high-emissivity layer 84 and, as a result, will be transmitted efficiently to the lower deposition preventive plate 82. Therefore, there is no need of providing a reflection plate, which is the case with the prior art, between the lower deposition preventive plate 82 and the block body 9 (below the heating means 10). In addition, since such an upper surface of the block body 9 as lies opposite to the lower deposition preventive plate 82 is also made up of a high-emissivity layer 93, together with the fact that the above-mentioned reflection plate is not interposed, the function in that the deposition preventive plate can be cooled during the vacuum processing cannot be impaired, the cooling being due to the radiation cooling from the block body 9.

A description has so far been made of an embodiment of this invention, but this invention shall not be limited to the above embodiment. As long as the essence of this invention is maintained, various modifications are possible. For example, in the above-mentioned embodiment, description was made of an example in which the vacuum processing apparatus was supposed to be a sputtering apparatus SM. But as long as deposition preventive plates are disposed inside the vacuum chamber, there are no particular restrictions. For example, this invention may be applicable to a dry etching apparatus, CVD apparatus and the like.

Figure 3:
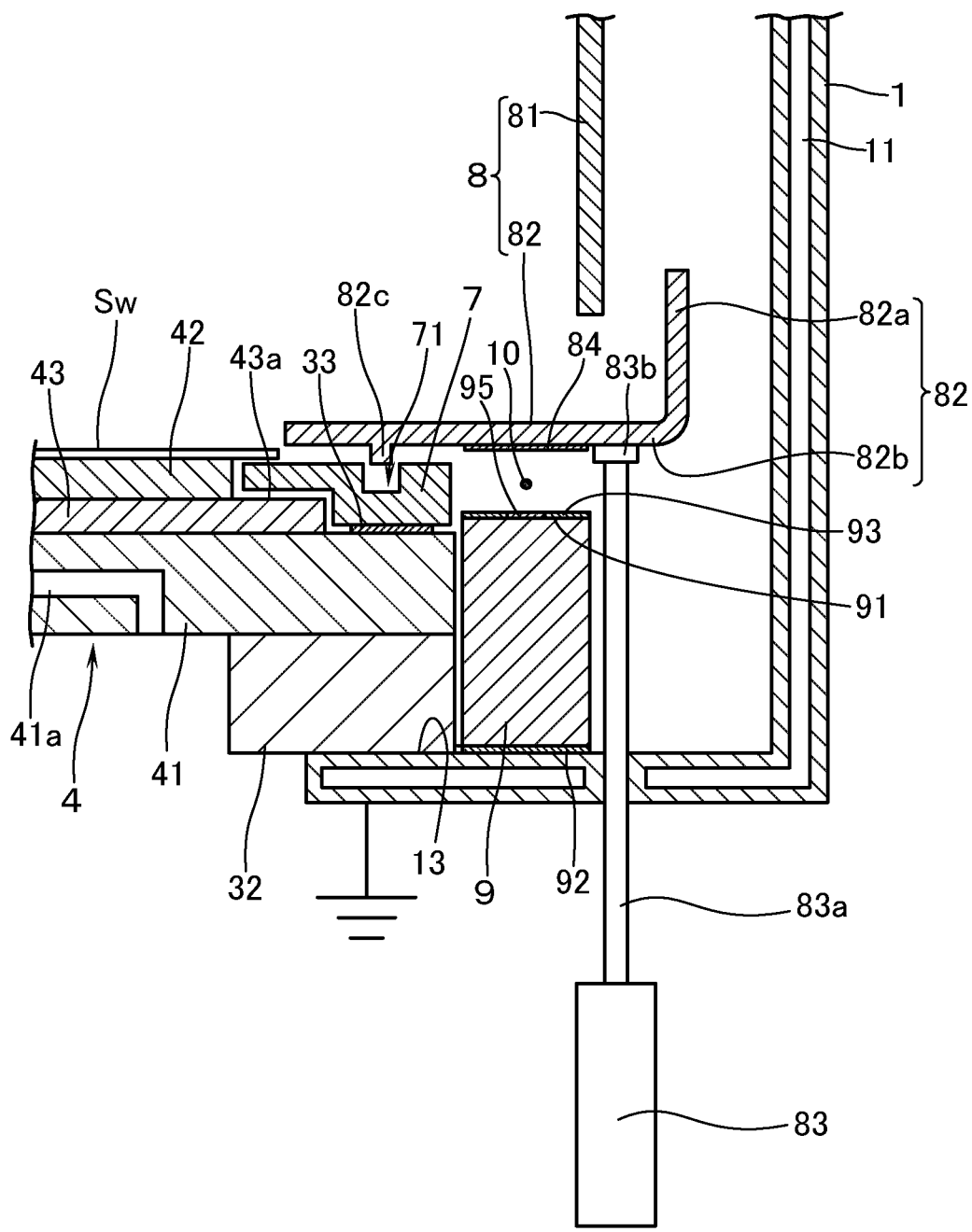
FIG. 3 is a sectional view showing in enlargement a modified example of this invention.

In the above-mentioned embodiment, a description was made of an example in which the entire upper surface 91 of the block body 9 is made up of a high-emissivity layer 93. However, as shown in FIG. 3, such a central portion of the upper surface 91 as lies opposite to the heating means 10 may be made up of a low-emissivity layer 95 whose emissivity has been lowered to 0.3 or below. This low-emissivity layer 95 can be obtained by: removing the high-emissivity layer 93 in the central portion of the upper surface of the block body 91, thereby exposing the parent metal surface of the block body 9; and then subjecting this exposed parent metal surface to mirror finishing (surface treatment) in order to obtain a range of arithmetic average roughness Ra of 0.01 to 2.00. By the way, the portion in which the high-emissivity layer 93 of the block body 9 is formed may lie opposite to the lower deposition preventive plate 82 at a predetermined angle thereto. Further, by performing surface treatment such as spray coating, film forming and the like to such a central portion of the surface of the high-emissivity layer 93 as lies opposite to the heating means 10, a low-emissivity layer 95 made up of Al, Cu, Au and Pt can also be formed. According to this arrangement, the heat rays from the heating means 10 can be reflected at the low-emissivity layer 95, thereby advantageously irradiating toward the lower deposition preventive layer 82.

Figure 4:
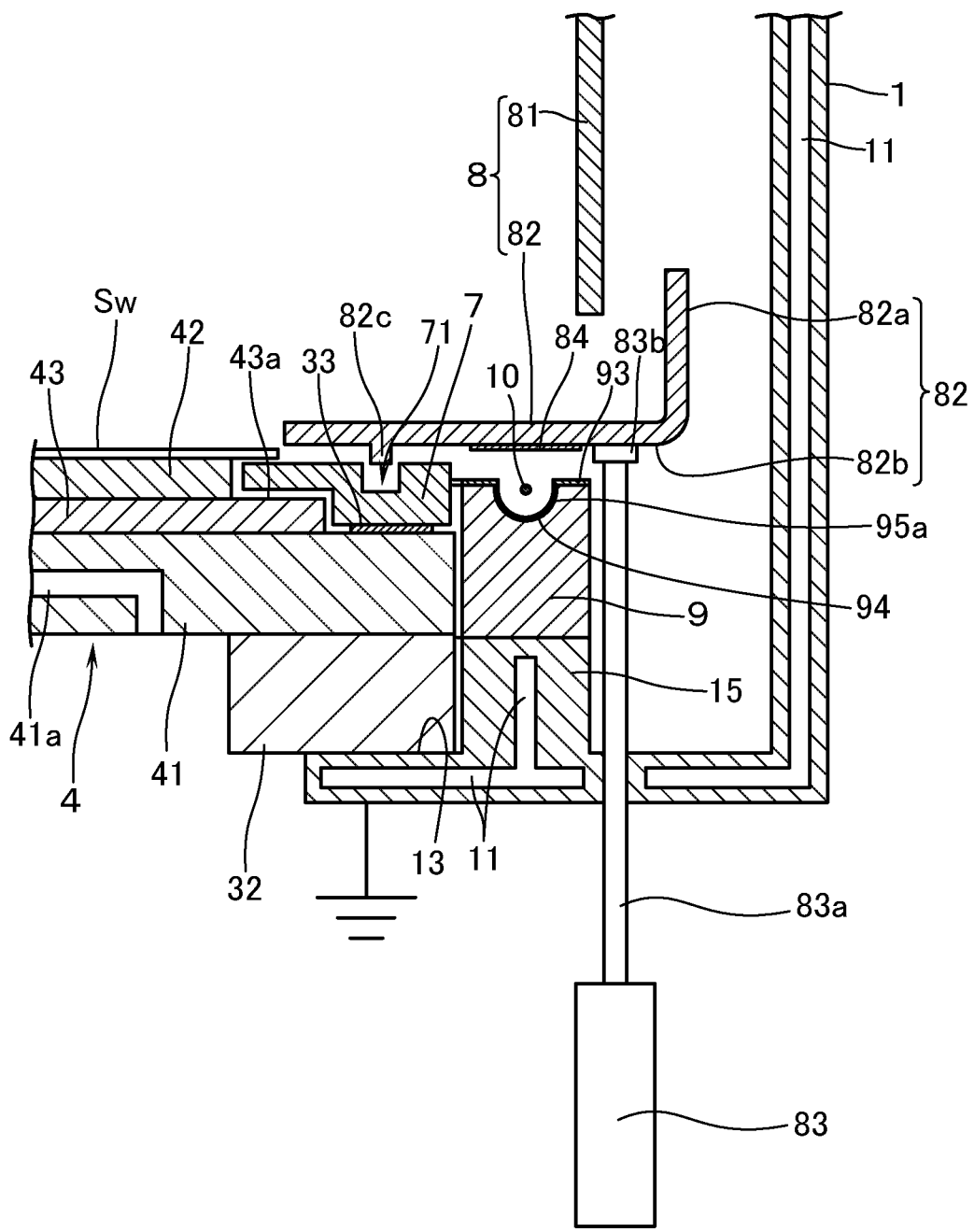
FIG. 4 is a sectional view showing in enlargement a modified example of this invention.

By the way, in cooling the lower deposition preventive layer 82, the distance between the block body 9 and the lower deposition preventive layer 82 shall preferably be small. As shown in FIG. 4, a first recessed part 94 may be formed on such a surface of the block body 9 as lies opposite to the lower deposition preventive layer 82 so as to house the heating means 10 in the inside space of the first recessed part 94, then the above-mentioned distance can be shortened. In this case, the inner surface of the first recessed part 94 can be made up, in the same manner as the above-mentioned low-emissivity layer 95, of a low-emissivity layer 95a having a lowered emissivity of 0.3 or below by performing mirror finishing (surface treatment) to the surface of the parent metal of the block body 9 such that the arithmetic average roughness Ra becomes a range of 0.01 to 2.00. Then, the heat rays from the heating means 10 can advantageously be reflected by the low-emissivity layer 95a, thereby irradiating to the lower deposition preventive layer 82. In addition, an attempt to reduce the emissivity to 0.1 or below will not be practical due to an increased cost. Therefore, the lower limit of the emissivity of the low-emissivity layer 95a can be set to 0.1 or more. Further, as the method of mirror finishing, known method may be employed alone or in combination: such as physical polishing like cutting, buffing and the like; electrolytic polishing; chemical polishing and the like. It is also possible for the surface of the parent metal of the block body 9 to be subjected to surface treatment such as spray coating, film forming and the like, thereby forming a low-emissivity layer 95a made up of Al, Cu, Au and Pt. Further, in case a sheath heater is employed as the heating means 10, such a part of the sheath heater 10 as faces the lower deposition preventive plate 82 (i.e., upper half side) may be subjected to surface treatment, in the same manner as the above-mentioned high-emissivity layers 93, 84, such as blasting, film forming of AlTiN film, or spray coating and the like, thereby forming a high-emissivity layer. It is thus possible to improve the heating efficiency.

By the way, as shown in FIG. 4, on a lower wall of the vacuum chamber 1, there may be integrally disposed an annular square flange 15 which protrudes toward the lower deposition preventive plate 82. Inside this square flange 15 there may be disposed the jacket 11 which is capable of circulating a coolant inside thereof. In this case, the block body 9 may be connected to the upper surface of the square flange 15. Then, the volume of the block body 9 can be minimized and the cooling efficiency improved. For connecting the square flange 15 and the block body 9, bolts made of molybdenum may be employed out of consideration of thermal conduction and the like. Alternatively, the square flange 15 may be disposed independent of the lower wall of the vacuum chamber 1. In this case, the coolant circulation passage may be formed inside the square flange so that the coolant can be circulated therein.

Figure 5:
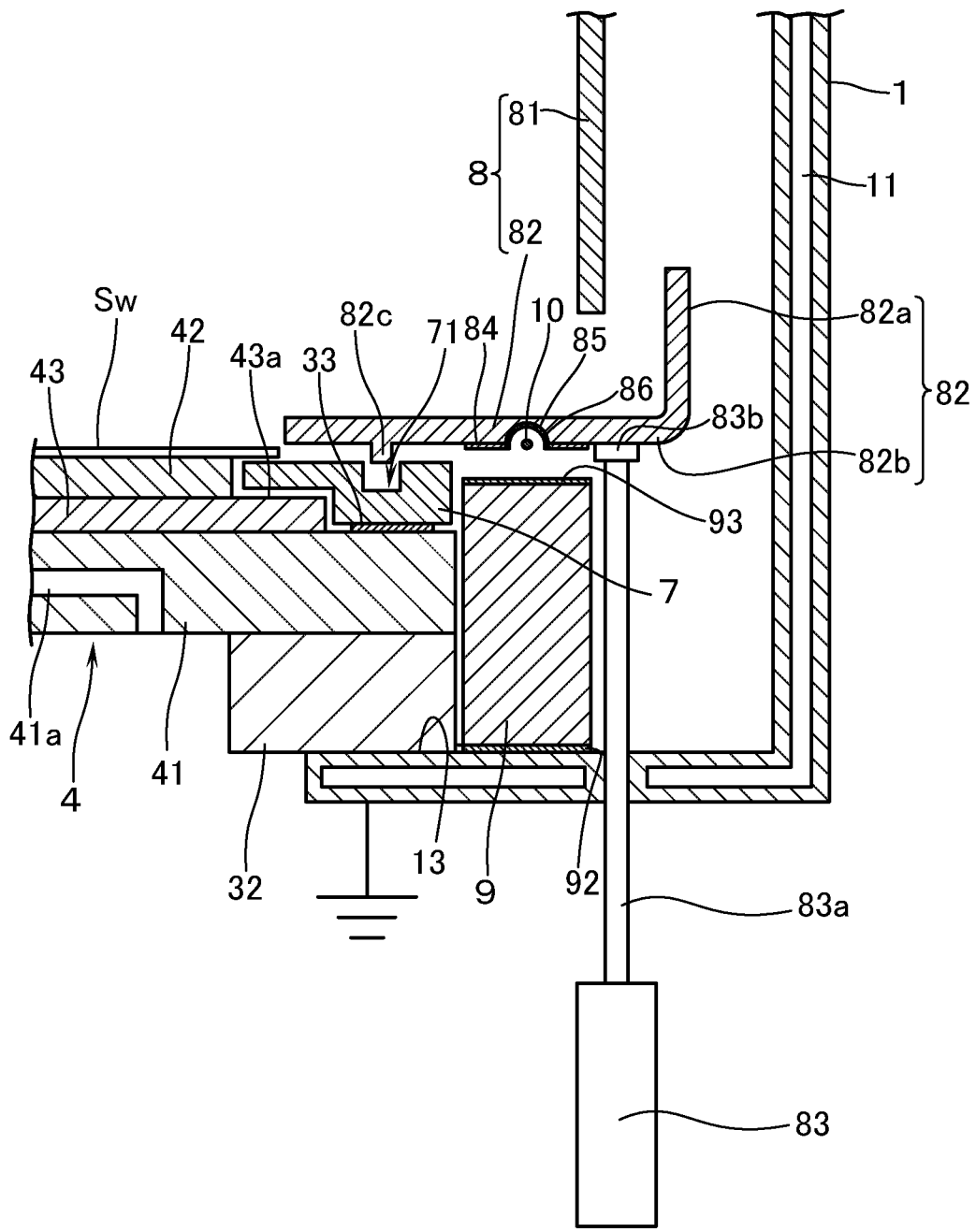
FIG. 5 is a sectional view showing in enlargement a modified example of this invention.

Further, as shown in FIG. 5, a second recessed part 85 may be formed on such a surface portion of the lower deposition preventive plate 82 as lies opposite to the block body 9. Then, by making an arrangement such that the heating means 10 is housed in the inside space of the second recessed part 85, the above-mentioned distance can be shortened. In this case, the inner surface of the second recessed part 85 may, in a manner similar to the above-mentioned high-emissivity layer 84, be subjected to surface treatment to the parent metal of the lower deposition preventive plate 82, thereby being made up of a high-emissivity layer 86 whose emissivity is raised to 0.5 or above. Then, the heat rays from the heating means 10 can advantageously be absorbed efficiently by the high-emissivity layer 86 for further transferring to the lower deposition preventive plate 82. Further, by making up of the high-emissivity layer, the surface of contact between the guide ring 83 and the lower deposition preventive plate 82, as well as the surface of laying the guide ring 83b opposite to the block body 9, the heat can be transmitted efficiently.

In the above-mentioned embodiments, descriptions were made based on an example of cooling the lower deposition preventive plate 82, but this invention can also be applied to an example of cooling the upper deposition preventive plate 81.

EXPLANATION OF MARKS

| | | | |
|---|---|---|---|
| SM | sputtering apparatus (vacuum processing apparatus) | | |
| Sw | substrate (to-be-processed substrate) | | |
| 1 | vacuum chamber | | |
| 13 | inner surface of lower wall (inner wall surface) of the vacuum chamber 1 | | |
| 8 | deposition preventive plate | | |
| 82 | lower deposition preventive plate (deposition preventive plate) | | |
| 84 | high-emissivity layer | 85 | second recessed part |
| 9 | block body | 93 | high-emissivity layer |
| 94 | first recessed part | 95, 95a | low-emissivity layer |
| 10 | heating means | 11 | jacket (cooling means) |

The invention claimed is:

1. A vacuum processing apparatus comprising a vacuum chamber for performing a vacuum processing on a to-be-processed substrate set in position inside the vacuum chamber having disposed therein a deposition preventive plate, the vacuum processing apparatus further comprising:
   a block body made of metal and vertically disposed along an inner wall surface of the vacuum chamber so as to lie opposite to a part of the deposition preventive plate with a clearance thereto;
   a cooling means for cooling the block body; and
   a heating means disposed spaced away between the part of the deposition preventive plate and the block body to enable to heat the deposition preventive plate by heat radiation,
   wherein such surface portions of the block body and the deposition preventive plate as lie opposite to each other are respectively made up of high-emissivity layers having an increased emissivity as a result of surface treatment to parent metal of the block body and the deposition preventive plate, respectively.

2. The vacuum processing apparatus according to claim 1, wherein such a surface portion of the block body as lies opposite to the heating means is made up of a low-emissivity layer having a lowered emissivity as a result of surface treatment to the parent metal of the block body.

3. The vacuum processing apparatus according to claim 1, further comprising a first recessed part formed on such a surface of the block body as lies opposite to the deposition preventive plate, wherein the heating means is housed in an inside space of the first recessed part.

4. The vacuum processing apparatus according to claim 3, wherein the inner surface of the first recessed part is made up of a low-emissivity layer having a lowered emissivity as a result of surface treatment to the parent metal of the block body.

5. The vacuum processing apparatus according to claim 1, wherein such a surface portion of the deposition preventive plate as lies opposite to the block body has formed therein a second recessed part, and wherein the heating means is housed in an inner space of the second recessed part.

6. The vacuum processing apparatus according to claim 1, wherein the cooling means 11 cools the block body 9 through heat transmission from the inner wall surface of the vacuum chamber by circulating a coolant of a predetermined temperature.

7. The vacuum processing apparatus according to claim 1, wherein the cooling means is located directly under the block body.

8. The vacuum processing apparatus according to claim 1, wherein the cooling means is located along and inside a wall of the vacuum chamber.

9. The vacuum processing apparatus according to claim 1, wherein the block body is in a cylindrical shape.

\* \* \* \* \*